United States Patent [19]
Kim

[11] Patent Number: 5,840,167
[45] Date of Patent: *Nov. 24, 1998

[54] SPUTTERING DEPOSITION APPARATUS AND METHOD UTILIZING CHARGED PARTICLES

[75] Inventor: Byeong-Chan Kim, Kyungki-do, Rep. of Korea

[73] Assignee: LG Semicon Co., Ltd, Chungcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 514,832

[22] Filed: Aug. 14, 1995

[51] Int. Cl.$^6$ .................................................. C23C 14/34
[52] U.S. Cl. ............................ 204/298.05; 204/298.06; 204/298.19
[58] Field of Search .................... 204/192.12, 298.05, 204/298.06, 298.08, 298.11, 298.19

[56] References Cited

U.S. PATENT DOCUMENTS

| | | | |
|---|---|---|---|
| 3,404,084 | 10/1968 | Hamilton | 204/298.05 |
| 4,389,299 | 6/1983 | Adachi et al. | 204/298.05 X |
| 4,692,230 | 9/1987 | Nihei et al. | 204/298.05 X |
| 4,761,199 | 8/1988 | Sato | 204/192.34 X |
| 4,885,070 | 12/1989 | Campbell et al. | 204/298.05 X |
| 4,908,334 | 3/1990 | Zuhr et al. | |
| 5,080,455 | 1/1992 | King et al. | |
| 5,099,791 | 3/1992 | Tsukazaki et al. | 204/298.05 X |
| 5,100,526 | 3/1992 | Ito | 204/298.05 |
| 5,110,435 | 5/1992 | Haberland | 204/298.05 X |
| 5,196,706 | 3/1993 | Keller et al. | |
| 5,211,994 | 5/1993 | Tsukazaki et al. | 204/298.05 X |
| 5,354,445 | 10/1994 | Ito et al. | 204/298.05 |

Primary Examiner—Nam Nguyen
Attorney, Agent, or Firm—Morgan, Lewis & Bockius LLP

[57] ABSTRACT

A sputtering deposition apparatus and method wherein a deposition material is sputtered from a target, the sputtered deposition material is ionized, and a thin film of the ionized deposition material is deposited onto a wafer.

13 Claims, 4 Drawing Sheets

FIG.1 – PRIOR ART
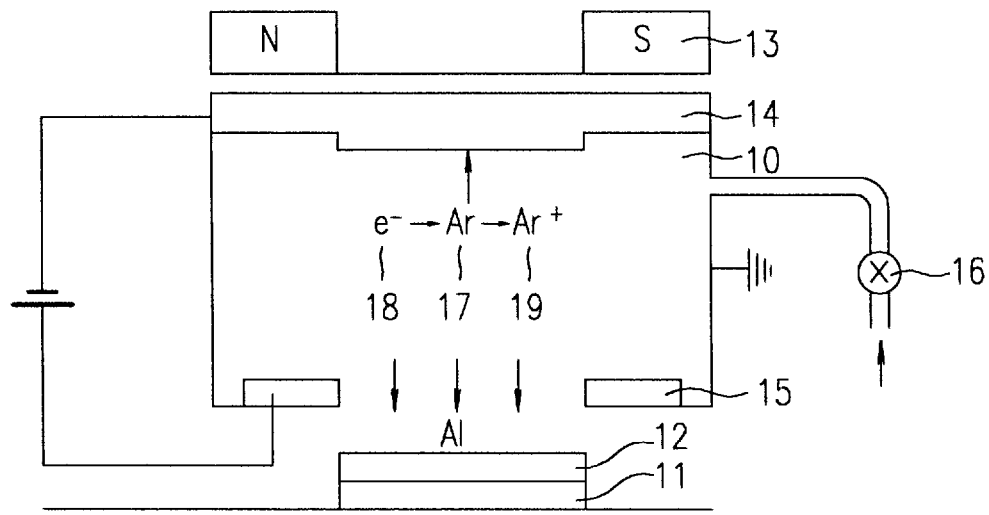
FIG.2 – PRIOR ART
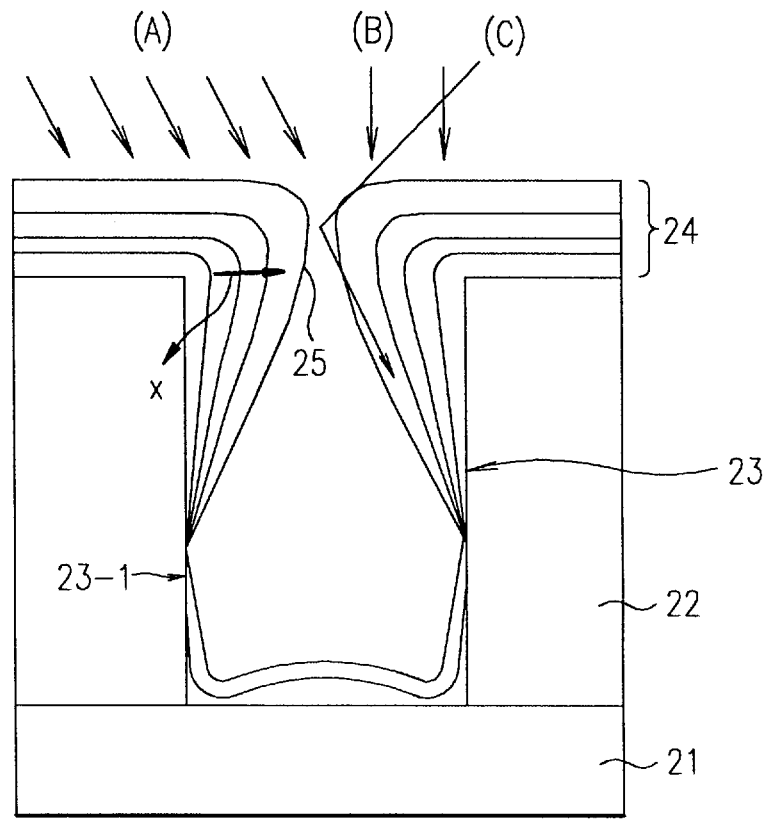

F I G.4
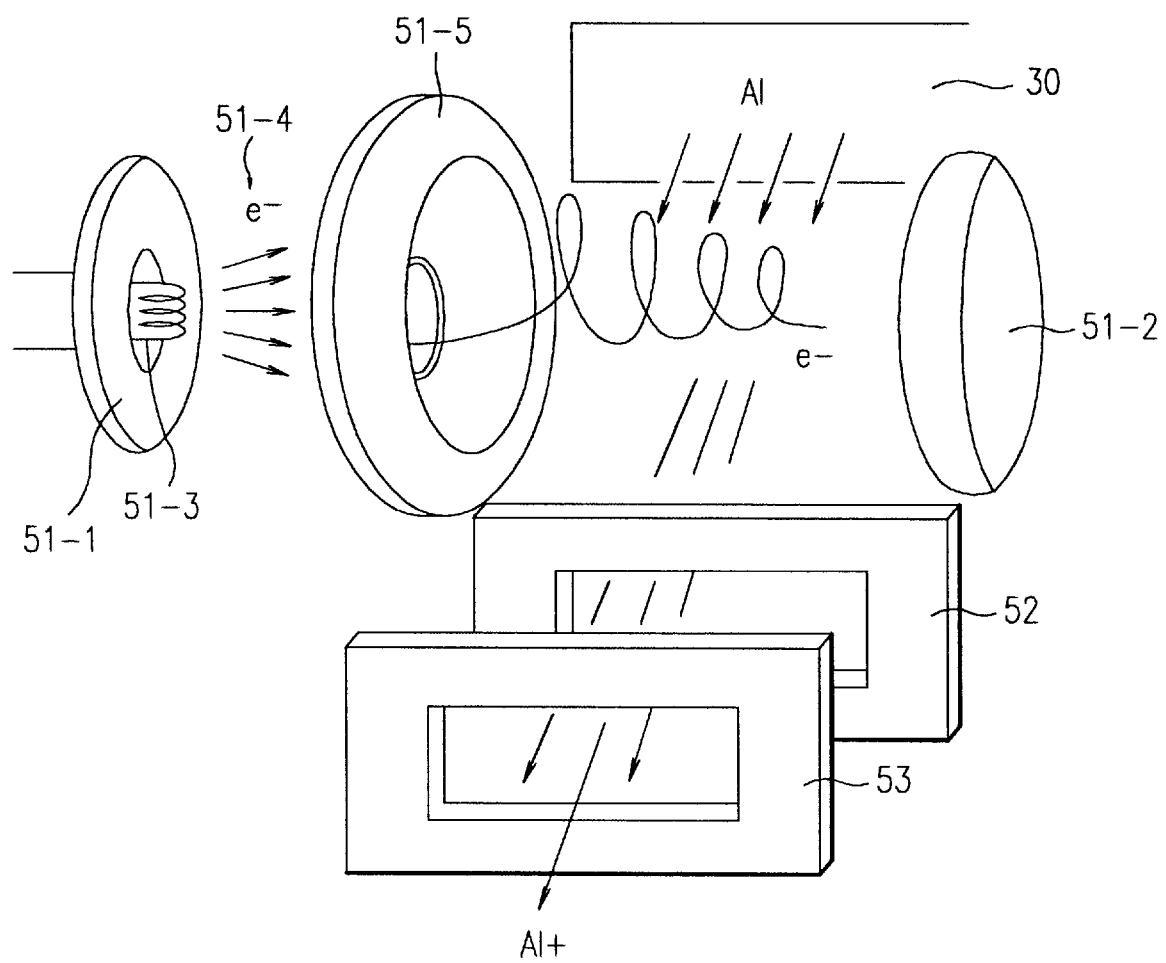

5,840,167

SPUTTERING DEPOSITION APPARATUS AND METHOD UTILIZING CHARGED PARTICLES

BACKGROUND OF THE INVENTION

1. Field of the Invention

The present invention relates to sputtering deposition, and more particularly to a sputtering deposition apparatus and method.

2. Discussion of the Related Art

FIG. 1 shows a schematic configuration of a conventional magnetron sputtering deposition apparatus. In the conventional magnetron sputtering deposition apparatus, a non-active gas, i.e., argon gas 17, maintained at a pressure of several millitorr, flows into a chamber 10 having a high vacuum state, e.g., $5 \times 10^{-6}$ torr through a valve 16. After the influx of argon gas 17 into chamber 10, plasma discharge from a residual gas occurs by applying a potential difference of between hundreds of volts and several kilovolts between a target, e.g., cathode 14, and an anode 15.

Electrons 18 generated by the plasma discharge move spirally in a magnetic field formed by a magnet 13 disposed behind cathode 14 and collide with the incoming non-active Ar gas 17. The collision of electrons 18 generated by the plasma discharge and argon gas 17 in high vacuum chamber 10 ionizes argon gas 17. That is, positive argon ions 19 are generated. These positive ions 19, which have a kinetic energy corresponding to the potential difference between cathode 14 and anode 15, i.e., between hundreds of eV and several KeV, are accelerated toward and collide with cathode 14.

When the positive ions 19 collide with cathode 14, metal atoms, e.g., Al atoms, are sputtered from the surface of cathode 14 so that a metal film 12 is deposited on a wafer 11. Over 99% of the metal atoms sputtered from the cathode 14 are electrically neutral particles and are deposited on wafer 11 with kinetic energies between hundreds of eV and several KeV. Accordingly, metal film 12 is formed centering around a reaction nucleus by adhering to wafer 11.

FIG. 2 shows a metal film deposited using the conventional sputtering deposition apparatus of FIG. 2. First, an insulation film 22 is formed on a substrate 21 and selectively etched to form a contact hole 23. Then, a metal film 24 is deposited. As shown in FIG. 2, the thickness of metal film 24 is not uniform over the surfaces of substrate 21 and insulation film 22. As also shown in FIG. 2, an overhang 25 is formed at an opening of contact hole 23. Overhang 25 is formed by sputtered metal atoms traveling in a direction (A) at an incline with respect to the surface of substrate 21. Overhang 25 grows in the direction of arrow X such that the opening of contact hole 23 gradually narrows. As a result, metal atoms traveling in the "B" and "C" directions cannot reach a side wall 23-1 and the bottom of contact hole 23, and therefore, the metal film is not successfully deposited there.

Accordingly, when metal film 24 is deposited using the conventional sputtering deposition apparatus, a step coverage of deposited metal film 24 becomes poor because of the overhang 25 as the aspect ratio of contact hole 23 increases, thereby degrading the electrical continuity of metal film 24 within contact hole 23. If the temperature used in depositing metal film 24 is reduced in an attempt to alleviate this problem, the electrical continuity of metal film 24 can be improved to some degree. However, since metal film 24 is narrow at side wall 23-1 of contact hole 23 due to the low transfer of metal atoms on the surface of substrate 21, the electric reliability of the deposited metal film deteriorates.

SUMMARY OF THE INVENTION

To solve the above problems, it is an object of the present invention to provide a sputtering deposition apparatus and method utilizing charged particles, wherein sputtered metal atoms are deposited in a perpendicular direction with respect to a wafer by freely adjusting the direction and kinetic energy of the metal atoms sputtered from a sputtering chamber.

It is another object of the present invention to provide a sputtering deposition apparatus and method utilizing charged particles, wherein the step coverage of a deposited film can be improved.

It is still another object of the present invention to provide a sputtering deposition apparatus and method utilizing charged particles, wherein the electric feature of a deposited film can be improved.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

Accordingly, to achieve the above objects there is provided a sputtering deposition apparatus, comprising sputtering means for sputtering a deposition material from a target, ionizing means for ionizing the sputtered deposition material, and electromagnetic field intercepting means for intercepting an electromagnetic field between the sputtering means and the ionizing means and for providing pure deposition material from the sputtering means to the ionizing means.

To further achieve the above objects, there is provided a sputtering deposition method, comprising the steps of sputtering a deposition material, ionizing the sputtered deposition material, and depositing a thin film of the ionized deposition material onto a wafer.

BRIEF DESCRIPTION OF THE DRAWINGS

The above objects and advantages of the present invention will become more apparent by describing in detail a preferred embodiment thereof with reference to the attached drawings in which:

FIG. 1 is a schematic configuration of a conventional sputtering deposition apparatus;

FIG. 2 is cross-sectional view of a metal film deposited in a contact hole using the sputtering deposition apparatus of FIG. 1;

FIG. 4 is a perspective view of a portion of the ion extracting electrode and the electrode collision ionizer of FIG. 3.

DETAILED DESCRIPTION OF THE PREFERRED EMBODIMENTS

Figure 3:
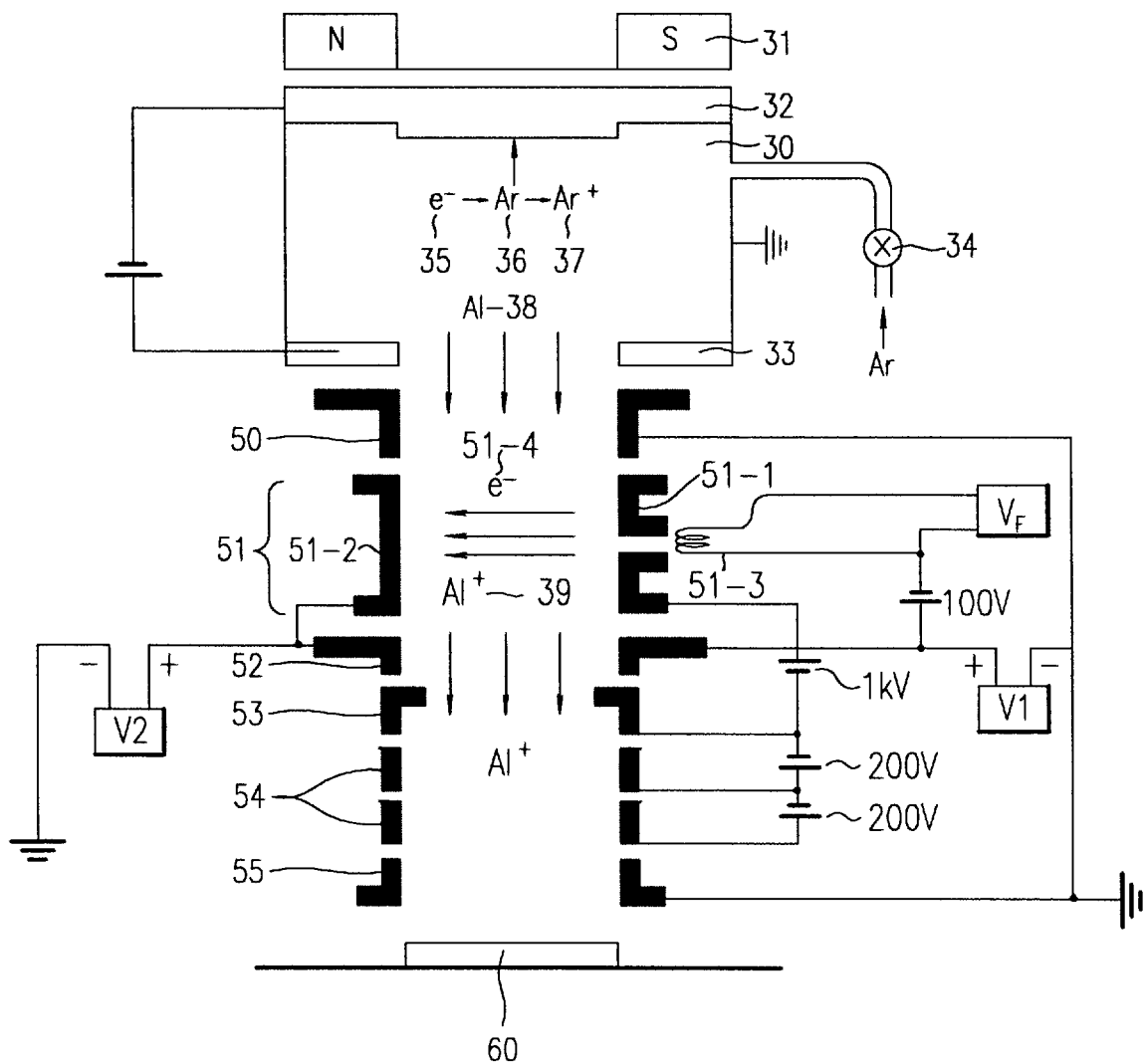
FIG. 3 is a schematic diagram of a sputtering deposition apparatus utilizing charged particles according to an embodiment of the present invention.

As shown in FIG. 3, a sputtering deposition apparatus utilizing charged particles according to the present invention comprises a sputtering chamber 30, an electron collision ionizer 51, a shield 50 for intercepting an electromagnetic field between sputtering chamber 30 and electron collision ionizer 51, an ion accelerator 52 for accelerating metal ions accelerated by electron collision ionizer 51, an ion extraction electrode 53 for extracting the metal ions accelerated by ion accelerator 52, and ion deceleration electrodes 54 and 55 for decelerating the accelerated metal ions passed through ion extraction electrode 53 and for depositing the decelerated metal ions on the surface of a wafer 60.

Sputtering chamber 30 can have the same structure as chamber 10 of the conventional sputtering deposition apparatus of FIG. 1. Neutral metal atoms, e.g., Al atoms 38, are sputtered from a target e.g., cathode 32, inside of sputtering chamber 30.

Shield 50 insulates electron collision ionizer 51 from the plasma state formed inside of sputtering chamber 30 and extracts the electromagnetic field produced in sputtering chamber 30 and pure neutral metal atoms, i.e., Al atoms, only excluding impurities such as electrons and argon gas. Shield 50 is positioned where wafer 11 of the conventional sputtering deposition apparatus of FIG. 1 is placed. Shield 50 is electrically grounded and pumped separately from sputtering chamber 30 to obtain a high vacuum.

Neutral metal atoms with a flux of $1\times10^{17}$ unit/cm$^2$-sec flow from sputtering chamber 30 into electron collision ionizer 51. The incoming metal atoms of $1\times10^{17}$ unit/cm$^2$-sec are the same as the flux of the metal atoms directed at wafer 11 of the sputtering deposition apparatus of FIG. 1.

Electron collision ionizer 51 ionizes the metal atoms sputtered from sputtering chamber 30 via shield 50 into metal ions. An electron collision ionization process signifies that a neutral gas atom turns into a metal positive ion when colliding against an electron having a rapid kinetic energy. This process is expressed as the following formula:

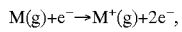

$$M(g)+e^-\rightarrow M^+(g)+2e^-,$$

wherein, M(g) refers to a gas atom.

Generally, when the kinetic energy of an electron (e$^-$) is 70 to 100 eV, the rate of ionization efficiency of a gas atom reaches its peak. Particularly in the case of an Al atom, a first ionization energy is about 6 eV, which is a little bit higher than that of the most easily ionizing alkali metals such as Li, Na, K and Rb, which have an ionization energy of about 5 eV. An Al atom is easily ionized on condition of plasma density over $10^{13}$ cm$^{-3}$ and electrons' kinetic energy over 50 eV. In practice, when the kinetic energy of an electron is beyond 50 eV, the ionization rate of an Al atom is $10^{-7}$ cm$^{-3}$/sec, which is larger than that of an Si atom and twice that of an Ar atom.

Ion accelerator 52 accelerates the metal ions generated by electron collision ionizer 51 with a kinetic energy according to a potential difference between ion accelerator 52 and ion extraction electrode 53. The potential difference between ion accelerator 52 and ion extraction electrode 53 is set to be suitable for extracting as many of the ions generated from electron collision ionizer 51 as possible. The potential deference between ion extraction electrode 53 and ion accelerator 52 is, for example, 1KV, as shown in FIG. 3.

Ion deceleration electrodes 54 and 55 decelerate the metal ions extracted through ion extraction electrode 53 and deposit the decelerated ions on the surface of wafer 60.

The sputtering deposition apparatus of the present invention does differential pumping to maintain the above components (50–55) at a high vacuum state of approximately $10^{-9}$ torr.

An electron collision ionization process performed by the sputtering deposition apparatus of FIG. 3 will now be described in detail with reference to FIG. 4.

As shown in FIG. 4, electron collision ionizer 51 comprises a filament 51-3 formed of a metal, such as tungsten W or tantalum Ta, a cathode 51-1, and an anode 51-2. When power of approximately 20A and 20V is supplied by a current power supply $V_F$ (FIG. 3) to filament 51-3, heat electrons 51-4 are emitted from the filament 51-3 at a high temperature of 3000K. The emitted electrons 51-4 are transferred from cathode 51-1 to anode 51-2 with a kinetic energy of approximately 100eV, which corresponds to a potential difference of approximately 100eV between cathode 51-1 and anode 51-2. A voltage power supply V2 (FIG. 3) generates this potential difference which determines the kinetic energy of electrons 51-4 between cathode 51-1 and anode 51-2.

If a magnet 51-5 having a magnetic force of 300–400 gauss is placed in the same axis direction as the direction of movement of electrons 51-4, the collision probability of metal particles and electrons increases since the electrons move spirally as shown in FIG. 4. In FIGS. 3 and 4, an Al atom is used as an example of the metal electron.

The Al atom, flowing from sputtering chamber 30 to electron collision ionizer 51 via electromagnetic field intercepting shield 50, collides against an electron 51-4 moving spirally at a high speed from cathode 51-1 to anode 51-2, and is thereby ionized as a positive metal ion, namely, Al$^+$. The positive metal ion is transferred to ion accelerator 52 with a kinetic energy corresponding to the 100V potential difference between ion accelerator 52 and filament power $V_F$.

The kinetic energy of the positive metal ion deposited onto wafer 60 is congruous with the potential difference between the anode of ion accelerator 52 and wafer 60, which is at ground potential, as shown in FIGS. 3 and 4. The kinetic energy of the positive metal ion can be adjusted by a voltage power supply V1 for generating a potential difference, by which the input energy of a metal ion is determined, between the anode of ion accelerator 52 and wafer 60. The potential applied to ion extraction electrode 53 and ion decelerating electrodes 54 and 55 has a constant value which is set on the basis of the anode of ion accelerator 52. That is, the constant kinetic energy of an ion can be obtained by adjusting the potential difference between ion accelerator 52 and wafer 60.

Ion accelerator 52, ion extraction electrode 53, and ion decelerating electrodes 54 and 55 extract as many of the positively ionized metal ions from electron collision ionizer 51 as possible and accelerate them to a desired kinetic energy by concentrating the extracted metal positive ions in a constant direction perpendicular to wafer 60. To make the positive metal ions ionized in electron collision ionizer 51 move toward wafer 60 and away from target 32 of sputtering chamber 30, the negative potential applied to ion extraction electrode 54 should be larger than that applied to cathode 32.

The method of depositing a metal film using the sputtering deposition apparatus of the present invention having the above structure will now be described.

Primarily, operation of chamber 30 of FIG. 3 is the same as that of sputtering chamber 10 in the sputtering deposition apparatus of FIG. 1. Namely, after a non-active gas, such as argon gas 36, is driven into sputtering chamber 30 in a high vacuum state through valve 34, electrons 35 are generated from plasma discharge when a potential difference is applied between cathode 32 and anode 33. These electrons move spirally in a magnetic field formed by magnet 31 at the rear of target 34 and collide with the incoming gas 36.

By colliding with electrons 35 formed by plasma discharge in high vacuum chamber 30, argon gas 36 is ionized so that positive ions, i.e., argon ions 37, are generated.

Positive argon ions 37 have a kinetic energy corresponding to the potential difference applied between cathode 32 and anode 33 and are accelerated toward and collide against cathode 32, which is negatively charged. When the positive ions collide against cathode 32, neutral metal atoms, i.e., Al atoms 38, are sputtered from target 32 and flow into electron collision ionizer 51 through electromagnetic intercepting shield 50.

The neutral metal atoms flowing into electron collision ionizer 51 are ionized into positive metal ions 39. In particular, positive metal ions 39 are generated by colliding moving electrons 51-4, having a kinetic energy corresponding to the potential difference between the cathode and anode, with neutral metal atoms 38 incoming through electromagnetic field intercepting shield 50.

Positive metal ions 39, which are generated in the above process, are deposited onto wafer 60 having kinetic energy corresponding to the potential difference V1 applied to the anode of ion accelerator 52. Between the anode of ion accelerator 52 and ion extraction electrode 53, a potential difference of −1KeV is formed so that the positively ionized metal ion after being accelerated with kinetic energy of 1KeV, are extracted through ion extraction electrode 53.

The extracted positive metal ions are gradually decelerated according to the potential difference applied to ion deceleration electrodes 54 and 55, and consequently, directed in a direction perpendicular to wafer 60. The potential difference between ion deceleration electrodes 54 and 55 is optimized as a value in which a flux of the most of the extracted ions can be maintained.

Figure 5:
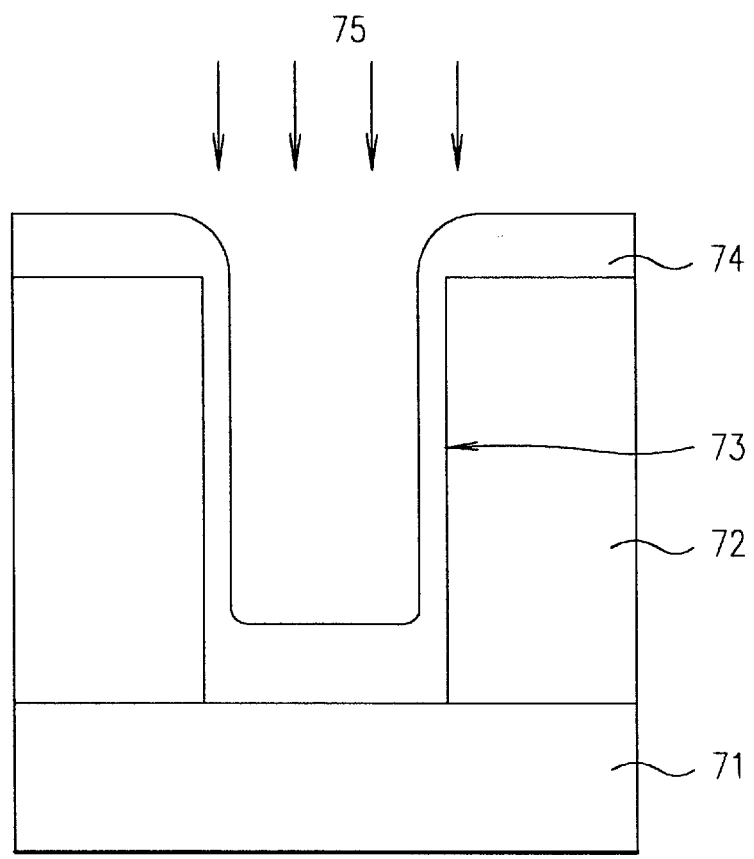
FIG. 5 is a cross-sectional view of a metal film deposited in a contact hole using the sputtering deposition apparatus of the present invention.

As shown in FIG. 5, according to the above process, extracted and accelerated metal ions 75, after being sputtered from target 32 in sputtering chamber 30 and ionized into metal ions, are deposited only in a perpendicular direction with respect to substrate 71. As a result, an overhang is not formed around an opening of contact hole 73 and a metal film 74 is uniformly deposited on insulation film 72 and substrate 71. Therefore, in depositing a metal film using the sputtering deposition apparatus and method utilizing charged particles of the present invention, a uniform metal film can be deposited without a void in contact hole 73.

As described above, the present invention has at least two advantages over the prior art. First, the present invention provides for improved step coverage. Since the sputtered deposition material is deposited only in a direction perpendicular to the wafer, an overhang in a contact hole of high aspect ratio is not formed, and therefore, a thin film is uniformly deposited at the side wall of the contact hole.

Second, the present invention provides for an improved deposited thin film. Since a metal ion such as $Al^+$ deposited on the wafer keeps a part of the kinetic energy before being deposited on the wafer, the metal ion has high movability on the surface of the metal. Accordingly, the deposition speed of the thin film is accelerated since the metal ion can be easily reach to a reaction nucleus due to its high surface movability.

Also, in the present invention, an intentional scar on a surface is made by inputting particles having high energy on the surface of a wafer in the early stage of deposition, by which a partial surface combination is made to be used as a reaction nucleus in the deposition. Further, since the deposition of thin film proceeds at an isolated place from a plasma atmosphere congested with argon gas and electrons, high purity thin films can be obtained.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A sputtering deposition apparatus comprising:
   sputtering means for sputtering a deposition material from a target, the sputtered deposition material being directed in a uniform direction substantially perpendicular to a substrate;
   ionizing means for ionizing the sputtered deposition material directed in the uniform direction by colliding the sputtered deposition material with electrons;
   electromagnetic field intercepting means for intercepting an electromagnetic field between the sputtering means and the ionizing means and for providing neutral deposition material from the sputtering means to the ionizing means, the electromagnetic field intercepting means being electrically grounded;
   accelerating means for accelerating the deposition material ionized by the ionizing means;
   extracting means for extracting a positively ionized deposition material from the accelerated deposition material, the extracting means having a potential difference from the accelerating means; and
   decelerating means for decelerating the ionized deposition material extracted by the extracting means and for depositing the deposition material thus decelerated onto a wafer.

2. The apparatus according to claim 1, wherein the decelerating means includes at least two ion decelerating electrodes for decelerating the ionized deposition material accelerated by the accelerating means in stages.

3. The apparatus according to claim 1, wherein the ionized deposition material is accelerated with a kinetic energy corresponding to a potential difference between the accelerating means and the extracting means.

4. The apparatus according to claim 1, wherein the ionized deposition material is deposited onto the wafer by a kinetic energy corresponding to a potential difference between the accelerating means and the wafer.

5. The apparatus according to claim 4, wherein the ionized deposition material is deposited onto the wafer only in a direction perpendicular to the wafer.

6. The apparatus according to claim 1, wherein the ionizing means includes:
   a filament for emitting electrons;
   a cathode and an anode for forming a predetermined potential difference and for moving the electrons by a kinetic energy corresponding to the potential difference; and
   a magnet for spirally moving electrons disposed between the cathode and anode.

7. The apparatus according to claim 6, wherein the ionizing means further includes a power supply for supplying power to the filament.

8. The apparatus according to claim 6, wherein the ionizing means further includes a power supply for generating the potential difference.

9. The apparatus according to claim 1, wherein a first potential is applied to the extracting means and a second, different potential is applied to the target such that the deposition material ionized by the ionizing means moves away from the target and towards the wafer.

10. The apparatus according to claim 9, wherein the value of the potential applied to the extracting means is selected to maximize the extraction of the ionized deposition material by the ionizing means.

11. The apparatus according to claim 1, further comprising a power supply for generating a potential difference between the accelerating means and the wafer, wherein an input energy of the deposition material ionized by the ionizing means and deposited onto a wafer is determined by the potential difference.

12. A sputtering deposition method comprising the steps of:

sputtering a deposition material being directed in a uniform direction substantially perpindicular to a substrate;

extracting neutral material from the sputtered deposition material;

ionizing the neutral deposition material by colliding the neutral deposition material with electrons having a kinetic energy;

accelerating the ionized deposition material;

extracting a positively ionized material from the accelerated ionized deposition material, the extracting means having a potential difference from the accelerating means;

decelerating the extracted ionized deposition material;

directing the ionized deposition material in a unicorn direaction substantially perpendicular to the substrate; and depositing a thin film of the ionized deposition material onto the substrate.

13. A sputtering deposition apparatus comprising:

sputtering means for sputtering a deposition material being directed in a uniform direction substantially perpendicular to a substrate;

electron generating means for generating electrons;

colliding means for colliding the electrons with the sputtered deposition material;

electromagnetic field intercepting means for intercepting an electromagnetic field between the sputtering means and the ionizing means and for providing neutral deposition material from the sputtering means to the ionizing means, the electromagnetic field intercepting means being electrically grounded; and depositing means for depositing the ionized deposition material onto the substrate, wherein the depositing means comprises, accelerating means for accelerating the deposition material ionized by the ionizing means, extracting means for extracting a positively ionized deposition material from the ionized deposition material, the extracting means having a potential difference from the accelerating means, and decelerating means for decelerating the ionized deposition material extracted by the extracting means in stages.

* * * * *

UNITED STATES PATENT AND TRADEMARK OFFICE
CERTIFICATE OF CORRECTION

PATENT NO.  : 5,840,167
DATED       : November 24, 1998
INVENTOR(S) : Byeong-Chan KIM It is certified that error appears in the above-indentified patent and that said Letters Patent is hereby corrected as shown below:

Column 8, line 1, change "unicorm" to --uniform--.

Column 8, line 2, change "direaction" to --direction--.

Signed and Sealed this

Eleventh Day of May, 1999

Attest:

Q. TODD DICKINSON

Attesting Officer

Acting Commissioner of Patents and Trademarks